US 8,144,530 B2

(12) United States Patent
Kim et al.

(10) Patent No.: US 8,144,530 B2
(45) Date of Patent: Mar. 27, 2012

(54) SEMICONDUCTOR MEMORY DEVICE AND METHOD FOR GENERATING OUTPUT ENABLE SIGNAL

(75) Inventors: Hyung-Soo Kim, Gyeonggi-do (KR); Yong-Ju Kim, Gyeonggi-do (KR); Sung-Woo Han, Gyeonggi-do (KR); Hee-Woong Song, Gyeonggi-do (KR); Ic-Su Oh, Gyeonggi-do (KR); Tae-Jin Hwang, Gyeonggi-do (KR); Hae-Rang Choi, Gyeonggi-do (KR); Ji-Wang Lee, Gyeonggi-do (KR); Jae-Min Jang, Gyeonggi-do (KR); Chang-Kun Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 344 days.

(21) Appl. No.: 12/494,403

(22) Filed: Jun. 30, 2009

(65) Prior Publication Data
US 2010/0315139 A1 Dec. 16, 2010

(30) Foreign Application Priority Data
Jun. 12, 2009 (KR) .................. 10-2009-0052320

(51) Int. Cl.
*G11C 7/00* (2006.01)
(52) U.S. Cl. ................. 365/194; 327/158; 365/233.13; 365/233.17
(58) Field of Classification Search ................ 327/142, 327/158; 365/193, 194, 233.13
See application file for complete search history.

(56) References Cited

U.S. PATENT DOCUMENTS

| 5,940,344 | A | * | 8/1999 | Murai et al. | 365/189.07 |
| 6,621,315 | B2 | * | 9/2003 | Heo et al. | 327/158 |
| 7,660,171 | B2 | * | 2/2010 | Jang | 365/194 |
| 7,672,191 | B2 | * | 3/2010 | Jang | 365/233.12 |
| 7,706,210 | B2 | * | 4/2010 | Kim et al. | 365/233.1 |
| 7,881,132 | B2 | * | 2/2011 | Shin | 365/194 |
| 7,944,772 | B2 | * | 5/2011 | Ahn et al. | 365/233.1 |
| 2006/0145894 | A1 | * | 7/2006 | Kim et al. | 341/50 |

FOREIGN PATENT DOCUMENTS

| KR | 1020080039076 | 5/2008 |
| KR | 1020080063877 | 7/2008 |

OTHER PUBLICATIONS

Notice of Allowance issued from Korean Intellectual Property Office on Nov. 30, 2010.

* cited by examiner

*Primary Examiner* — Alexander Sofocleous
(74) *Attorney, Agent, or Firm* — IP & T Group LLP

(57) ABSTRACT

A semiconductor memory device is able to generate an output enable signal in response to a read command and CAS latency information. The semiconductor memory device includes a delay locked loop configured to detect a phase difference of an external clock signal and a feedback clock signal, generate a delay control signal corresponding to the detected phase difference, and generate a DLL clock signal by delaying the external clock signal for a time corresponding to the delay control signal, a delay configured to output an active signal as an output enable reset signal in response to the delay control signal and an output enable signal generator configured to be reset in response to the output enable reset signal and generate an output enable signal in response to a read signal and a CAS latency signal by counting the external clock signal and the DLL clock signal.

14 Claims, 3 Drawing Sheets

SEMICONDUCTOR MEMORY DEVICE AND METHOD FOR GENERATING OUTPUT ENABLE SIGNAL

CROSS-REFERENCE TO RELATED APPLICATIONS

The present application claims priority under 35 U.S.C. §119(a) to a Korean Patent Application No. 10-2009-0052320, filed in the Korean Intellectual Property Office on Jun. 12, 2009, which is incorporated herein by reference in its entirety.

BACKGROUND OF THE INVENTION

The present invention relates to a semiconductor design technology, and more particularly, to a semiconductor memory device for generating an output enable signal in response to a read command and CAS latency information and a method for generating an output enable signal.

In general, a semiconductor memory device such a Double Data Rate Synchronous DRAM (DDR SDRAM) receives a read command synchronized with an external clock signal during a read operation and outputs data synchronized with an internal clock signal to an external device. That is, a semiconductor memory device uses an internal clock signal to output data instead of an external clock signal. Therefore, a semiconductor memory device needs synchronizing a read command, which is synchronized with an external clock signal, to an internal clock signal in order to perform a read operation. In view of a read command, a synchronized clock signal is changed from an external clock signal to an internal clock signal. It is referred to as domain crossing.

A semiconductor memory device includes various circuits for performing domain crossing. For example, a semiconductor memory device includes an output enable signal generating circuit for performing domain crossing. The output enable signal generating circuit synchronizes a read command, which is synchronized with an external clock signal, to an internal clock signal and outputs the read command as an output enable signal. After completely performing domain crossing, the output enable signal includes CAS latency information. A semiconductor memory device uses such an output enable signal to output data at a desired time with being synchronized to an external clock signal after receiving a read command.

For reference, the CAS latency includes information on time duration from a time of applying a read command to a time of outputting desired data in one cycle of an external clock signal as a unit time. The CAS latency information is generally stored in a mode register set (MRS) in a semiconductor memory device.

A skew is generated between an external clock signal and an internal clock signal due to delay elements in a semiconductor memory device. In order to compensate the skew, a semiconductor memory device includes an internal clock signal generating circuit. The internal clock signal generating circuit includes a phase locked loop circuit and a delay locked loop circuit. A DLL clock generated from a delay locked loop circuit is exemplarily described as an internal clock signal.

FIG. 1 is a block diagram illustrating an output enable signal generating circuit of a semiconductor memory device.

Referring to FIG. 1, the output enable signal generating circuit includes a reset signal synchronizer 110, an initialize 120, a DLL clock counter 130, an OE delay replica model 140, an external clock counter 150, a latch unit 160, and a comparator 170.

Hereinafter, an operation of an output enable signal generating circuit will be described.

The DLL clock counter 130 and the external clock counter 150 DLL are reset by a clock counter reset signal RST_DLL and an external clock counter reset signal RST_EXT in response to an output enable reset signal RST_OE. The DLL clock counter 130 counts a DLL clock signal CLK_DLL and the external clock counter 150 counts an external clock signal CLK_EXT. The DLL clock counter 130 performs a counting operation from an initial counting value which is setup by the initialize 120 corresponding to CAS latency.

When a read signal RD is activated in response to a read command and applied, the latch unit 160 latches an external clock counting value CNT_EXT<0:2> counted by the external clock counter 150 and outputs the latched counting value CNT_LAT<0:2>. The comparator 170 compares a DLL clock counting value CNT_DLL<0:2> from the DLL clock counter 130 and the latched counting value CNT_LAT<0:2> and activates an output enable signal OE when the DLL clock counting value CNT_DLL<0:2> becomes identical to the latched counting value CNT_LAT<0:2>.

The output enable signal OE is a signal synchronized with the DLL clock signal CLK_DLL and includes CAS latency (CL) information. The semiconductor memory device uses the output enable signal OE to output data.

The output enable signal generating circuit is reset at a DLL reset mode, at a power down mode, and when CAS latency (CL) stored in an MRS is changed. In these states, domain crossing of an external clock signal CLK_EXT and a DLL clock signal CLK_DLL cannot be smoothly performed. Therefore, the DLL clock counter 130 and the external clock counter 150 are reset in response to an output enable reset signal RST_OE. The output enable reset signal RST_OE is a pulse signal synchronized with a DLL clock signal CLK_DLL or an external clock signal CLK_EXT after delayed based on a corresponding state. That is, the output enable reset signal RST_OE may have a domain corresponding to a DLL clock signal CLK_DLL or a domain corresponding to an external clock signal CLK_EXT.

The reset signal synchronizer 110 includes a flip-flop for synchronizing an output enable reset signal RST_OE to a DLL clock signal CLK_DLL. An activation edge of a DLL clock signal CLK_DLL input to the flip-flop may become close to an activation edge of an output enable reset signal RST_OE. In this case, a synchronizing operation cannot be performed because it is impossible to sufficiently secure a setup/hold time. Such a problem becomes more serious according to a process, a voltage, and a temperature (PVT). In order to prevent this problem, the reset signal synchronizer 110 includes a plurality of flip-flops arranged in cascade.

FIG. 2 is a block diagram illustrating a reset signal synchronizer 110 of FIG. 1.

Referring to FIG. 2, the reset signal synchronizer 110 includes a plurality of flip-flops and each of the flip-flops receives a DLL clock signal CLK_DLL. An output enable reset signal RST_OE is synchronized with a DLL clock signal CLK_DLL through the flip-flops. Finally, the DLL clock counter reset signal RST_DLL is output with synchronized to the DLL clock signal CLK_DLL.

However, the reset signal synchronizer 110 having a plurality of flip-flops in cascade cause another problem. The reset signal synchronizer 110 having a plurality of flip-flops may reduce an error generation rate because a setup/hold time of activation edges of a DLL clock signal CLK_DLL and an output enable reset signal RST_OE can be secured as the number of flip-flops increases. However, if a frequency of a DLL clock signal CLK_DLL increases, the error generation rate increases again due to the setup/hold time. It is expected that such an error generation rate increases continuously because an operation speed of a semiconductor memory device increases gradually.

As the reset signal synchronizer 110 includes more flip-flops, a circuit area also increases in proportion to the increased number of flip-flops and an activation time of a DLL clock counter reset signal RST_DLL becomes gradually slow. If an activation time of a DLL clock counter reset signal RST_DLL becomes slow, a time of counting operation in the DLL clock counter 130 and the external clock counter 150 become also slow. It means that a time of receiving a read signal RD and a time of activating an output enable signal OE also become slow. Finally, it slows down an operation speed of a semiconductor memory device.

SUMMARY OF THE INVENTION

An embodiment of the present invention is directed to providing a semiconductor memory device for activating an output enable reset signal in an active operation period performed before a read operation and driving an output enable signal generating circuit in response to the activated output enable reset signal.

Another embodiment of the present invention is directed to providing a semiconductor memory device for generating an output enable reset signal using a delay time reflected in a delay locked loop.

In accordance with an aspect of the present invention, there is provided a semiconductor memory device having a delay locked loop configured to detect a phase difference of an external clock signal and a feedback clock signal, generate a delay control signal corresponding to the detected phase difference, and generate a DLL clock signal by delaying the external clock signal for a time corresponding to the delay control signal; a delay configured to output an active signal as an output enable reset signal in response to the delay control signal; and an output enable signal generator configured to be reset in response to the output enable reset signal and generate an output enable signal in response to a read signal and a CAS latency by counting the external clock signal and the DLL clock signal.

In accordance with an aspect of the present invention, there is provided a method for generating an output enable signal. The method for generating an output enable signal includes generating an output enable reset signal by delaying an active signal for a delay amount of a delay locked loop where the active signal is activated during an active operation period and being reset in response to the output enable reset signal and generating the output enable signal in response to a read command and a CAS latency by counting an external clock signal and a DLL clock signal that is output from the delay locked loop.

The semiconductor memory device according to the present invention uses a delay time reflected in a delay locked loop to generate the output enable reset signal. Therefore, it is possible to sufficiently secure a setup/hold time between the output enable reset signal and the DLL clock signal irrespective of the operation frequency of the semiconductor memory device. The semiconductor memory device according to the present invention generates the output enable reset signal activated in an active operation period and controls the operation of the output enable signal generating circuit through the output enable reset signal. Therefore, a power consumption period of the output enable signal generating circuit is minimized. Although the operation frequency of a semiconductor memory device increases, it is possible to sufficiently secure a setup/hold time of the output enable reset signal and the DLL clock signal. Due to the sufficient setup/hold time, a circuit area for synchronizing the output enable reset signal can be minimized.

BRIEF DESCRIPTION OF THE DRAWINGS

Features of the present invention will become apparent to those skilled in the art from the following description with reference to the figures, in which.

DESCRIPTION OF SPECIFIC EMBODIMENTS

Other objects and advantages of the present invention can be understood by the following description, and become apparent with reference to the embodiments of the present invention.

Figure 1:
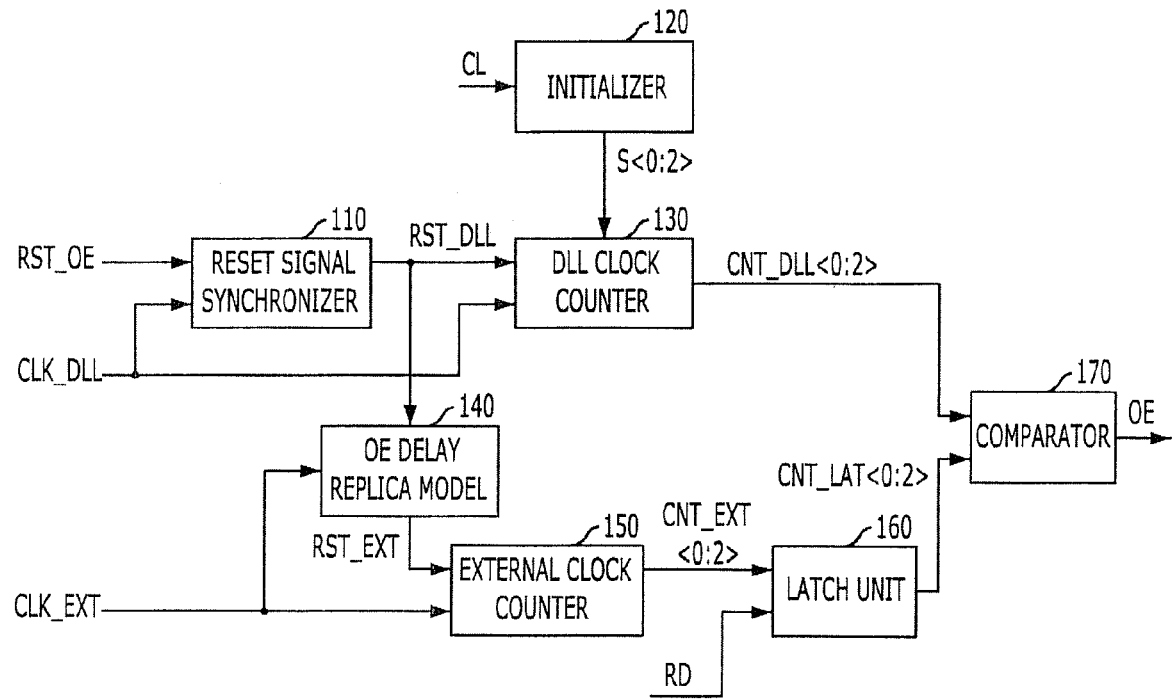
FIG. 1 is a block diagram illustrating an output enable signal generating circuit of a semiconductor memory device according to a related art.
Figure 2:
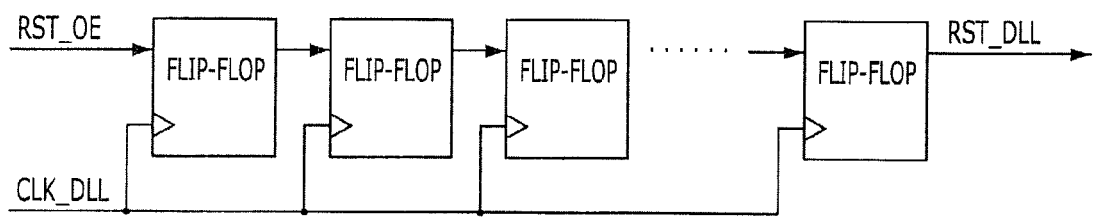
FIG. 2 is a block diagram illustrating a reset signal synchronizer 110 of FIG. 1.
Figure 3:
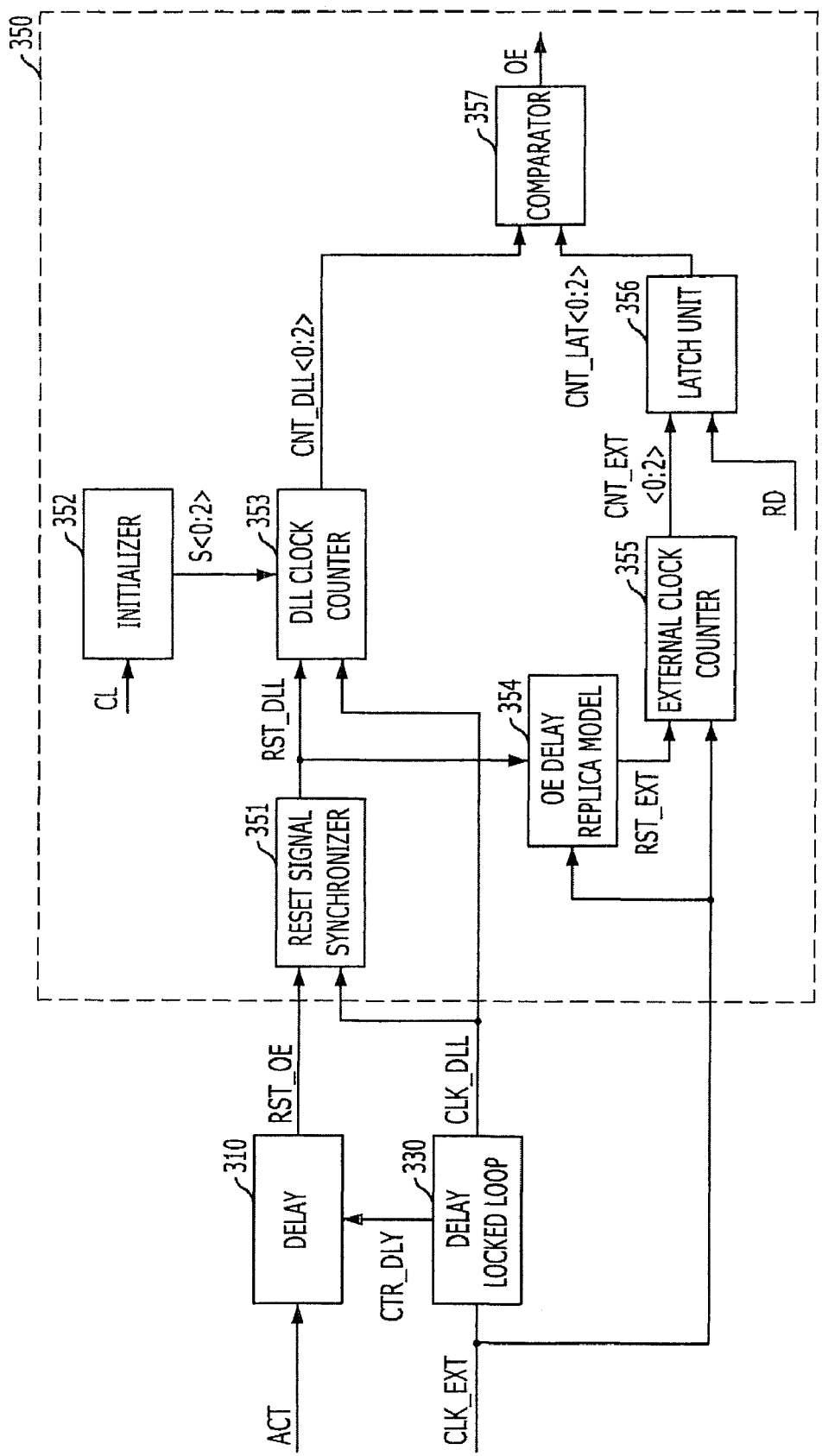
FIG. 3 is a block diagram partially illustrating a semiconductor memory device in accordance with an embodiment of the present invention.

FIG. 3 is a block diagram partially illustrating a semiconductor memory device in accordance with an embodiment of the present invention.

Referring to FIG. 3, the semiconductor memory device according to the present embodiment includes a delay 310, a delay locked loop 330, and an output enable signal generator 350.

The delay 310 receives an active signal ACT and generates output enable reset signal RST_OE by delaying the active signal ACT for a time corresponding to a delay control signal CTR_DLY. Here, the active signal ACT is a signal activated during an active operation period of a semiconductor memory device, and the output enable reset signal RST_OE is the active signal ACT delayed for a time corresponding to the delay control signal CTR_DLY. The output enable reset signal RST_OE may have a predetermined logic level value according to a state corresponding to the active signal ACT. Meanwhile, the delay control signal CTR_DLY is generated by the delay locked loop 330 and it will be described in more detail with reference to FIG. 4.

The delay locked loop 330 compensates a phase difference between an external clock signal CLK_EXT and a DLL clock signal CLK_DLL. The delay locked loop 330 receives the external clock signal CLK_EXT and generates the DLL clock signal CLK_DLL. The external clock signal CLK_EXT is delayed for a time corresponding to a delay control signal CTR_DLY while passing through the delay locked loop 330. As a result, the DLL clock signal CLK_DLL is output from the delay locked loop 330. The delay locked loop 330 will be described in more detail with reference to FIG. 4.

The output enable signal generator 350 is reset in response to the output enable reset signal RST_OE, counts the external clock signal CLK_EXT and the DLL clock signal CLK_DLL, and generates an output enable signal OE corresponding to a read signal RD and a CAS latency CL. The output enable signal generator 350 includes a reset signal synchronizer 351, an initializer 352, a DLL clock counter 353, an OE delay replica model 354, an external clock counter 355, a latch unit 356, and a comparator 357.

The reset signal synchronizer 351 generates a DLL clock counter reset signal RST_DLL by synchronizing an output enable reset signal RST_OE with a DLL clock signal CLK_DLL. The semiconductor memory device according to the present embodiment generates the output enable reset signal RST_OE by delaying the active signal ACT for a time corresponding to the delay control signal CTR_DLY. Therefore, it is possible to sufficiently secure a setup/hold time of the output enable reset signal RST_OE and the DLL clock signal CLK_DLL. It means that the reset signal synchronizer 351 may be formed of minimum synchronizing circuit, for example, one flip-flop.

The initializer 352 provides an initial counting value corresponding to the CAS latency CL to the DLL clock counter 353. In other words, the initializer 352 sets up an initial counting value of the DLL clock counter 353 with an output signal S<0:2> corresponding to the CAS latency CL. In the present embodiment, the output signal S<0:2> of the initializer 352 is 3 bits.

The DLL clock counter 353 is reset in response to the DLL clock counter reset signal RST_DLL and counts a DLL clock signal CLK_DLL from an initial counting value corresponding to the output signal S<0:2> of the initializer 352. The DLL clock counter 353 generates a DLL clock counting value CNT_CLL<0:2> by counting a DLL clock signal CLK_DLL from an initial counting value set up according to the CAS latency CL.

The OE delay replica model 354 is modeling of a delay difference value between an external clock signal CLK_EXT and a DLL clock signal CLK_DLL used in the output enable signal generator 350. The OE delay replica model 352 delays the DLL clock counter reset signal RST_DLL for an asynchronous delay time and outputs an external clock counter reset signal RST_EXT by synchronizing the delayed DLL clock counter reset signal RST_DLL to the external clock signal CLK_EXT.

The external clock counter 355 is reset in response to an external clock counter reset signal RST_EXT and generates an external clock counting value CNT_EXT<0:2> by counting an external clock signal CLK_EXT. It is preferable that the initial counting value of the external clock counter 355 is setup as 0.

The latch unit 356 latches the external clock counting value CNT_EXT<0:2> from the external clock counter 355 in response to the read signal RD and outputs the latched counting value CNT_LAT<0:2>.

The comparator 357 compares a DLL clock counting value CNT_CLL<0:2> with the latched counting value CNT_LAT<0:2> and activates the output enable signal OE when the DLL clock counting value CNT_CLL<0:2> becomes identical to the latched counting value CNT_LAT<0:2>. The output enable signal OE is a signal synchronized with the DLL clock signal CLK_DLL and includes the CAS latency information. Since the semiconductor memory device outputs data using the output enable signal OE, the semiconductor memory device can output data by synchronizing the data with the external clock signal CLK_EXT at a time corresponding to the CAS latency CL after the read signal RD is activated.

In other words, in the semiconductor memory device according to the present embodiment, the output enable signal generator 350 is reset in response to the active signal ACT and generates the output enable signal OE corresponding to the read signal RD and the CAS latency CL by counting the external clock signal CLK_EXT and the DLL clock signal CLK_DLL. That is, the output enable signal generator 350 performs operation only during an activation period of the active signal ACT. Since the output enable signal generator 350 operates only during a necessary period for the output enable signal OE, it is possible to minimize a power consumption of a semiconductor memory device.

For reference, the external clock signal CLK_EXT used in the delay locked loop 330 may be a buffered signal from a buffer that buffers a clock from an external device. The external clock signal CLK_EXT used in the external clock counter 355 may be a clock signal used in the delay locked loop 330 or a buffered signal from an additional buffer. That is, if the external clock signal CLK_EXT is electrically coupled to the delay locked loop 330 and the external clock counter 355, the delay locked loop 330 and the external clock counter 355 use the external clock signal CLK_EXT.

Figure 4:
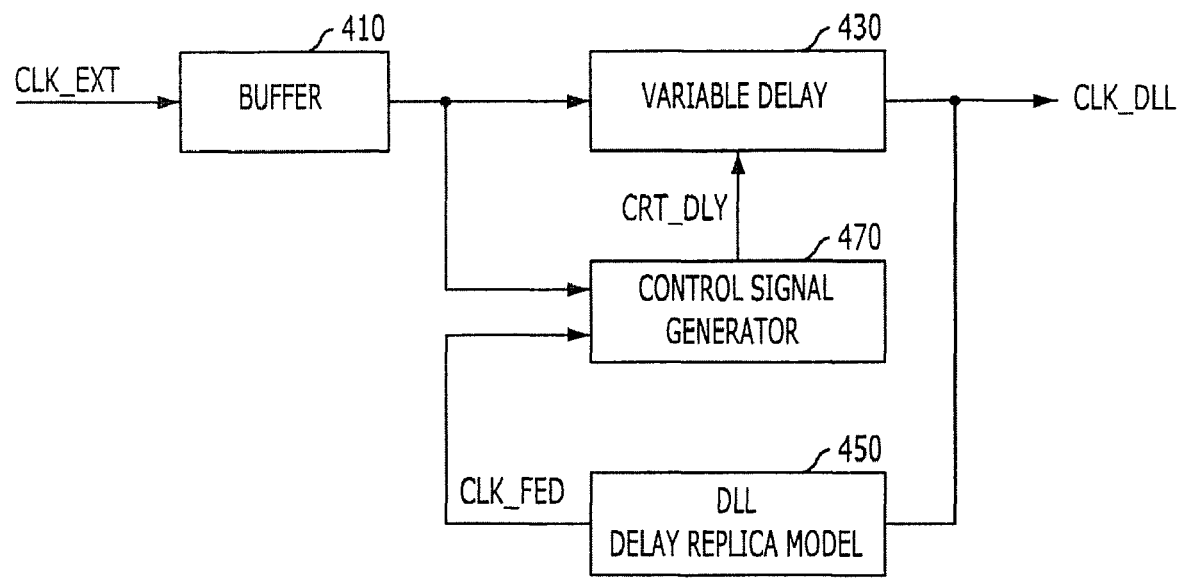
FIG. 4 is a block diagram illustrating a delay locked loop 330 of FIG. 3.

FIG. 4 is a block diagram illustrating a delay locked loop 330 of FIG. 3.

Referring to FIG. 4, the delay locked loop 330 includes a buffer 410, a variable delay 430, a DLL delay replica model 450, and a control signal generator 470.

The buffer 410 buffers an external clock signal CLK_EXT from an external device, the variable delay 430 generates a DLL clock signal CLK_DLL by delaying an output signal of the buffer 410 for a time corresponding to a delay control signal CTR_DLY. The variable delay 430 includes a plurality of unit delay cells for delaying an input signal for a predetermined time in response to the delay control signal CTR_DLY.

The DLL delay replica model 450 is modeling of a delay time in the buffer 410 and a delay time on a clock path of a DLL clock signal CLK_DLL. The DLL delay replica model 450 receives a DLL clock signal CLK_DLL and generates a feedback clock signal CLK_FED by delaying the DLL clock signal CLK_DLL for the modeled time. The control signal generator 470 compares a phase of the output signal of the buffer 410 with a phase of the feedback clock signal CLK_FED and generates a delay control signal CTR_DLY based on the comparison result.

The delay 310 of FIG. 3 may be designed as a plurality of delay cells identical to the variable delay 430 of FIG. 4. Also, the delay 310 may use a delay control signal CTR_DLY generated from the delay locked loop 330. For reference, if the delay 310 designed as a plurality of unit delay cells, a plurality of delay control signals CTR_DLY may be generated corresponding to the number of unit delay cells.

Therefore, the active signal ACT input to the delay unit 310 is delayed for a delay amount of the delay locked loop 330 according to the delay control signal CTR_DLY, that is, for a time delayed in the variable delay 430 of the delay locked loop 330. That is, the active signal ACT is delayed for a time corresponding to a phase difference of the external clock signal CLK_EXT and the feedback clock signal CLK_FED and is output as the enable reset signal RST_OE. Here, it is preferable that the delay control signal CTR_DLY may have a value corresponding to a locking time of the delay locked loop 330.

In the present embodiment, the output enable reset signal RST_OE is generated by delaying the active signal ACT for a time corresponding to the delay control signal CTR_DLY. In this case, the active signal ACT has a domain corresponding to the DLL clock signal CLK_DLL. As a result, it is possible to sufficiently secure a setup/hold time between the output enable reset signal RST_OE and the DLL clock signal CLK_DLL. Therefore, the reset signal synchronizer 351 according to the present embodiment can synchronize the output enable reset signal RST_OE to the DLL clock signal CLK_DLL without including a plurality of flip-flops. That is, the reset signal synchronizer 351 according to the present embodiment can stably perform a synchronization operation with a minimum synchronizing circuit because a sufficient setup/hold time is secured between the output enable reset signal RST_OE and the DLL clock signal CLK_DLL.

Since it is not necessary to perform a synchronization operation with a clock to generate an output enable reset signal RST_OE, the semiconductor memory device according to the present embodiment is not influenced by an operation frequency. That is, although the operation frequency of a semiconductor memory device increases, it is possible to guarantee stable synchronization of the output enable reset signal RST_OE and the DLL clock signal CLK_DLL.

The semiconductor memory device according to the present embodiment generates the output enable reset signal activated in an active operation period and controls the operation of the output enable signal generating circuit through the output enable reset signal. Therefore, a power consumption period of the output enable signal generating circuit is minimized.

Although the operation frequency of a semiconductor memory device increases, it is possible to sufficiently secure a setup/hold time of the output enable reset signal and the DLL clock signal. Due to the sufficient setup/hold time, a circuit area for synchronizing the output enable reset signal can be minimized.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
   a delay locked loop configured to detect a phase difference of an external clock signal and a feedback clock signal, generate a delay control signal corresponding to the detected phase difference, and generate a DLL clock signal by delaying the external clock signal for a time corresponding to the delay control signal;
   a delay unit configured to receive an active signal and output the active signal as an output enable reset signal in response to the delay control signal; and
   an output enable signal generator configured to be reset in response to the output enable reset signal and generate an output enable signal in response to a read signal and a CAS latency signal by counting the external clock signal and the DLL clock signal.

2. The semiconductor memory device of claim 1, wherein the delay unit has a delay amount variable in response to the delay control signal.

3. The semiconductor memory device of claim 1, wherein the output enable signal generator includes:
   a reset signal synchronizer configured to synchronize the output enable reset signal to the DLL clock signal;
   a first counter configured to be reset in response to an output signal of the reset signal synchronizer and count the DLL clock signal from an initial counting value corresponding to the CAS latency signal—;
   a delay replica model configured to delay an output signal of the reset signal synchronizer for a time modeled corresponding to the external clock signal and the DLL clock signal;
   a second counter configured to be reset in response to an output signal of the delay replica model and count the external clock signal;
   a latch unit configured to latch an output value of the second counter in response to the read signal; and
   a comparator configured to generate the output enable signal by comparing an output value of the first counter with an output value of the latch unit.

4. The semiconductor memory device of claim 3, wherein the reset signal synchronizer includes a flip-flop configured to latch the output enable reset signal in response to the DLL clock signal.

5. The semiconductor memory device of claim 1, wherein the delay locked loop includes:
   a variable delay configured to generate the DLL clock signal by delaying the external clock signal for a time corresponding to the delay control signal;
   a delay replica model configured to generate the feedback clock signal by reflecting delay of a clock path of the DLL clock signal to the DLL clock signal; and
   a control signal generator configured to generate the delay control signal by comparing a phase of the external clock signal with a phase of the feedback clock signal.

6. The semiconductor memory device of claim 5, wherein the delay unit has a structure identical to the variable delay.

7. The semiconductor memory device of claim 1, wherein the delay unit includes a plurality of unit delay cells for delaying input signals for a predetermined time in response to the delay control signal.

8. The semiconductor memory device of claim 7, wherein the number of the plurality of unit delay cells is a number corresponding to the delay control signal.

9. The semiconductor memory device of claim 1, wherein the active signal has a predetermined level in response to a reset operation of the output enable signal generator.

10. A method for generating an output enable signal, comprising:
    generating a DLL clock signal by delaying an external clock signal for a time corresponding to a delay control signal in a delay locked loop:
    generating an output enable reset signal by delaying an active signal for a delay amount corresponding to the delay control signal, wherein the active signal is activated during an active operation period; and
    resetting an output enable signal generator in response to the output enable reset signal and generating the output enable signal in response to a read command and a CAS latency signal by counting the external clock signal and the DLL clock signal that is output from the delay locked loop.

11. The method of claim 10, wherein generating the DLL clock signal includes locking the DLL clock signal corresponding to the external clock signal.

12. The method of claim 11, wherein locking the DLL clock signal corresponding to the external clock signal includes:
    generating a feedback clock signal reflected with a clock path of the DLL clock signal; and
    generating the delay control signal by comparing a phase of the external clock signal with a phase of the feedback clock.

13. The method of claim 10, wherein generating the output enable signal includes:
    synchronizing the output enable reset signal with the DLL clock signal;
    resetting the output enable signal generator in response to an output signal from synchronizing the output enable reset signal, and counting the DLL clock signal from an initial counting value corresponding to the CAS latency signal;

outputting a reset signal by delaying the output signal from synchronizing the output enable reset signal for a time modeled corresponding to the external clock signal and the DLL clock signal;

resetting the output enable signal generator in response to the reset signal and counting the external clock signal; and latching a value of counting the external clock signal in response to the read command and activating the output enable signal when the latched value of counting the external clock signal becomes identical to a value of counting the DLL clock signal.

14. The method of claim 10, wherein the active operation period is defined in response to the active signal having a predetermined level in a reset operation.

* * * * *